United States Patent
Okawa et al.

(10) Patent No.: US 9,183,858 B2
(45) Date of Patent: Nov. 10, 2015

(54) DUAL CAPPING LAYER UTILIZED IN A MAGNETORESISTIVE EFFECT SENSOR

(71) Applicant: HGST Netherlands B.V., Amsterdam (NL)

(72) Inventors: Norihiro Okawa, Odawari (JP); Koujiro Komagaki, Odawara (JP)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/166,699

(22) Filed: Jan. 28, 2014

(65) Prior Publication Data

US 2015/0213816 A1    Jul. 30, 2015

(51) Int. Cl.
G11B 5/39    (2006.01)

(52) U.S. Cl.
CPC ............... *G11B 5/3912* (2013.01); *G11B 5/39* (2013.01); *G11B 5/3906* (2013.01)

(58) Field of Classification Search
CPC ........ G11B 5/33; G11B 5/332; G11B 5/3903; G11B 5/3906; G11B 5/3912; G11B 5/3929; G11B 2005/3996
USPC .......... 360/319, 324.1, 324.11, 324.12, 324.2
See application file for complete search history.

(56) References Cited

U.S. PATENT DOCUMENTS

| | | | |
|---|---|---|---|
| 6,700,757 B2 | 3/2004 | Pinarbasi | |
| 7,715,155 B2 | 5/2010 | Kagami et al. | |
| 8,514,525 B2 | 8/2013 | Childress et al. | |
| 8,553,370 B2 | 10/2013 | Hong et al. | |
| 8,553,371 B2 | 10/2013 | Zhu et al. | |
| 8,780,505 B1 * | 7/2014 | Xiao | 360/319 |
| 8,780,506 B1 * | 7/2014 | Maat et al. | 360/319 |
| 8,797,692 B1 * | 8/2014 | Guo et al. | 360/319 |
| 2005/0195535 A1 * | 9/2005 | Shi et al. | 360/324.12 |
| 2006/0114620 A1 | 6/2006 | Sbiaa et al. | |
| 2007/0217084 A1 * | 9/2007 | Xue et al. | 360/324.12 |
| 2008/0088986 A1 * | 4/2008 | Horng et al. | 360/324.2 |
| 2009/0046395 A1 * | 2/2009 | Maehara et al. | 360/319 |
| 2009/0174968 A1 * | 7/2009 | Singleton et al. | 360/319 |
| 2009/0279213 A1 * | 11/2009 | Wu et al. | 360/319 |
| 2011/0096443 A1 * | 4/2011 | Zhang et al. | 360/324.2 |
| 2011/0273802 A1 | 11/2011 | Zhou et al. | |
| 2011/0279923 A1 | 11/2011 | Miyauchi et al. | |
| 2011/0298456 A1 | 12/2011 | Lu et al. | |
| 2012/0063034 A1 | 3/2012 | Hsu et al. | |
| 2013/0222949 A1 * | 8/2013 | Braganca et al. | 360/324.11 |
| 2013/0236744 A1 | 9/2013 | Brinkman et al. | |
| 2014/0104729 A1 * | 4/2014 | Singleton et al. | 360/319 |
| 2014/0252518 A1 * | 9/2014 | Zhang et al. | 257/422 |
| 2015/0116868 A1 * | 4/2015 | Lu et al. | 360/319 |

OTHER PUBLICATIONS

Office action dated Jun. 22, 2015 for application GB1501239.6.

* cited by examiner

*Primary Examiner* — Jefferson Evans
(74) *Attorney, Agent, or Firm* — Patterson & Sheridan, LLP

(57) ABSTRACT

The present disclosure generally relates to a read head sensor in a magnetic recording head. The read head sensor comprises a dual capping layer in a sensor stack that may reduce magnetic coupling so as to enhance magnetic bias field, e.g., domain control, in the read head sensor. Furthermore, an upper shield with multiple film stack having different film properties may also be utilized to enhance bias field generated to the read head sensor. Additionally, a coil structure may be positioned adjacent to a side shield to enhance bias field generation in the read head sensor.

11 Claims, 5 Drawing Sheets

DUAL CAPPING LAYER UTILIZED IN A MAGNETORESISTIVE EFFECT SENSOR

BACKGROUND OF THE DISCLOSURE

1. Field of the Disclosure

Embodiments of the present disclosure generally relate to a magnetic read head sensor for use in a hard disk drive. The read head sensor is a magnetoresistive effect type. In particular, the embodiments relate to read head sensors utilizing dual capping layer in the sensors.

2. Description of the Related Art

The heart of a computer is a magnetic disk drive which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider towards the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing, the write and read heads are employed for writing and reading magnetic transitions corresponding to host data. The read and write heads are connected to a signal processing circuitry that operates according to a computer program to implement the writing and reading functions.

The read head of a hard disk drive includes a spin valve element utilizing a magnetoresistive effect. By sensing the relative magnetizations of two ferromagnetic thin films, such as a free magnetic layer and a pinned magnetic layer, sandwiching an intermediate layer, magnetic information can be read from nanoscale magnets on the disk. Reductions in various dimensions of the sensor element and improvements in the film characteristics have contributed to improvements in recording density, allowing current recording tracks to achieve a width less than approximately 100 nanometers. However, as the track width is narrowed, the effect of noise (mag-noise) generated by thermal vibrations during magnetization of the free magnetic layer on the head signal-to-noise ratio (SNR) become prohibitively large. Since the mag-noise increases proportionally as the playback output increases, the head SNR saturates at some maximum value. Thus, a reduction in the mag-noise has become increasingly important. Magnetic biasing (domain control) of the free magnetic layer as well as the control for low magnetic coupling is effective in reducing mag-noise.

Therefore, there is a need in the art for a sensor structure that may minimize mag-noise with low magnetic coupling in the sensor structure.

SUMMARY

The present disclosure generally relates to a read head sensor in a magnetic recording head. The read head sensor comprises a dual capping layer that may reduce magnetic coupling so as to enhance magnetic biasing field, e.g., domain control, in the read head sensor. Furthermore, an upper shield with multiple film stack having different film properties may also be utilized to enhance bias field generation in the read head sensor. Additionally, a coil structure may be positioned adjacent to a side shield. The coil structure positioned adjacent to the side shield may effectively change and adjust the bias field generated to the sensor, so as to efficiently control the signal-to-noise ratio (SNR) and increase domain control of the read head sensor.

In one embodiment, a read head sensor includes a lower shield, a upper shield disposed over the lower shield, and a sensor stack disposed between the lower shield and the upper shield wherein the sensor stack comprises a pinned magnetic layer, a spacer layer disposed above the pinned magnetic layer, a free magnetic layer disposed above the spacer layer, and a dual capping layer disposed on the free magnetic layer, the dual capping layer including a magnetic layer disposed on a nonmagnetic layer, and a side shield disposed adjacent the sensor stack above the lower shield and below the upper shield.

In another embodiment, a read head sensor includes a lower shield, a upper shield disposed over the lower shield, wherein the upper shield includes a bottom magnetic layer including a first magnetic layer and a second magnetic layer disposed on the first magnetic layer, a first nonmagnetic layer disposed on the bottom magnetic layer, a top magnetic layer disposed on the first nonmagnetic layer, the top magnetic layer including a three-layer magnetic film stack, and an antiferromagnetic layer disposed on the top magnetic layer, a sensor stack disposed between the lower shield and the upper shield, and a side shield disposed adjacent the sensor stack above the bottom shield and below the top shield.

In another embodiment, a read head sensor includes a lower shield, a upper shield disposed over the lower shield, a sensor stack disposed between the lower shield and the higher shield, and a side shield disposed adjacent the sensor stack above the lower shield and below the upper shield, and a coil structure disposed coupled to the side shield.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
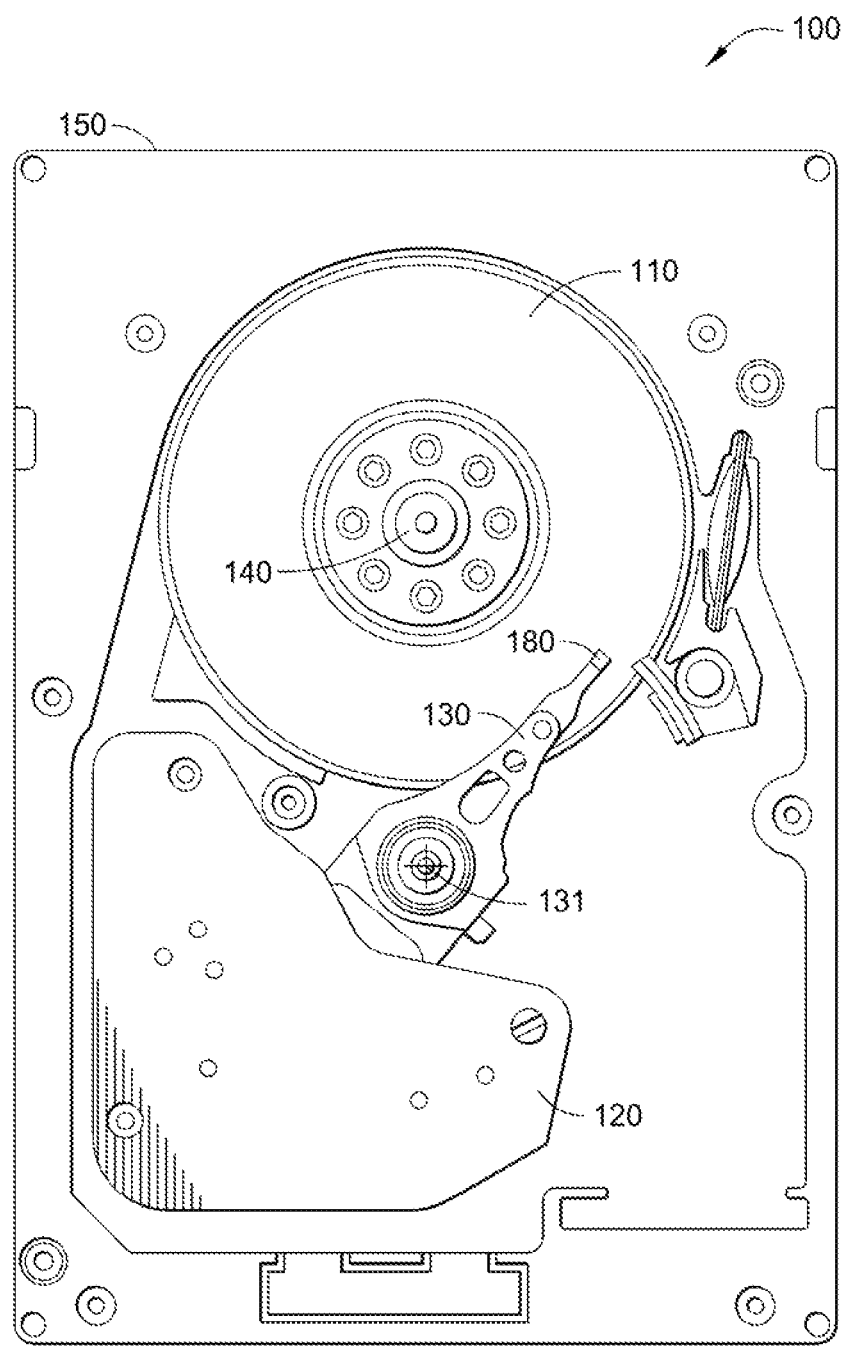
FIG. 1 illustrates an exemplary magnetic disk drive, according to an embodiment of the disclosure.

To facilitate understanding, identical reference numerals have been used, where possible, to designate identical elements that are common to the figures. It is contemplated that elements disclosed in one embodiment may be beneficially utilized on other embodiments without specific recitation. It is to be noted, however, that the appended drawings illustrate only typical embodiments of this disclosure and are therefore not to be considered limiting of its scope, for the disclosure may admit to other equally effective embodiments in any field involving magnetic sensors.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a read head sensor in a magnetic recording head. The read head sensor comprises side shields in addition to a sensor stack sandwiched between an upper shield and a lower shield. The upper shield is a multilayer structure with antiferromagnetic coupling. The magnetic coupling from the upper shield to the sensor stack is controlled low so as to enhance magnetically bias field as generated as well as domain control of a free layer formed in the sensor stack. In one embodiment, the low magnetic coupling is obtained by utilizing a top dual capping layer formed on the free layer in the sensor stack. Additionally, multiple film layers with different film property arrangement may also be utilized in the upper shield. A coil structure may also be disposed adjacent to the side shield to enhance bias field generation.

FIG. 1 illustrates a top view of an exemplary hard disk drive (HDD) 100, according to an embodiment of the disclosure. As illustrated, the HDD 100 may include one or more magnetic disks 110, actuator 120, actuator arms 130 associated with each of the magnetic disks 110, and spindle motor 140 affixed in a chassis 150. The one or more magnetic disks 110 may be arranged vertically as illustrated in FIG. 1. Moreover, the one or more magnetic disks 110 may be coupled with the spindle motor 140.

Magnetic disks 110 may include circular tracks of data on both the top and bottom surfaces of the disk 110. A magnetic head 180 is mounted and coupled to the actuator arms 130. As each disk 110 spins, data may be written on and/or read from the data track. The actuator arm 130 may be configured to swivel around actuator axis 131 to place the magnetic head 180 on a particular data track in the disk 110.

Figure 2:
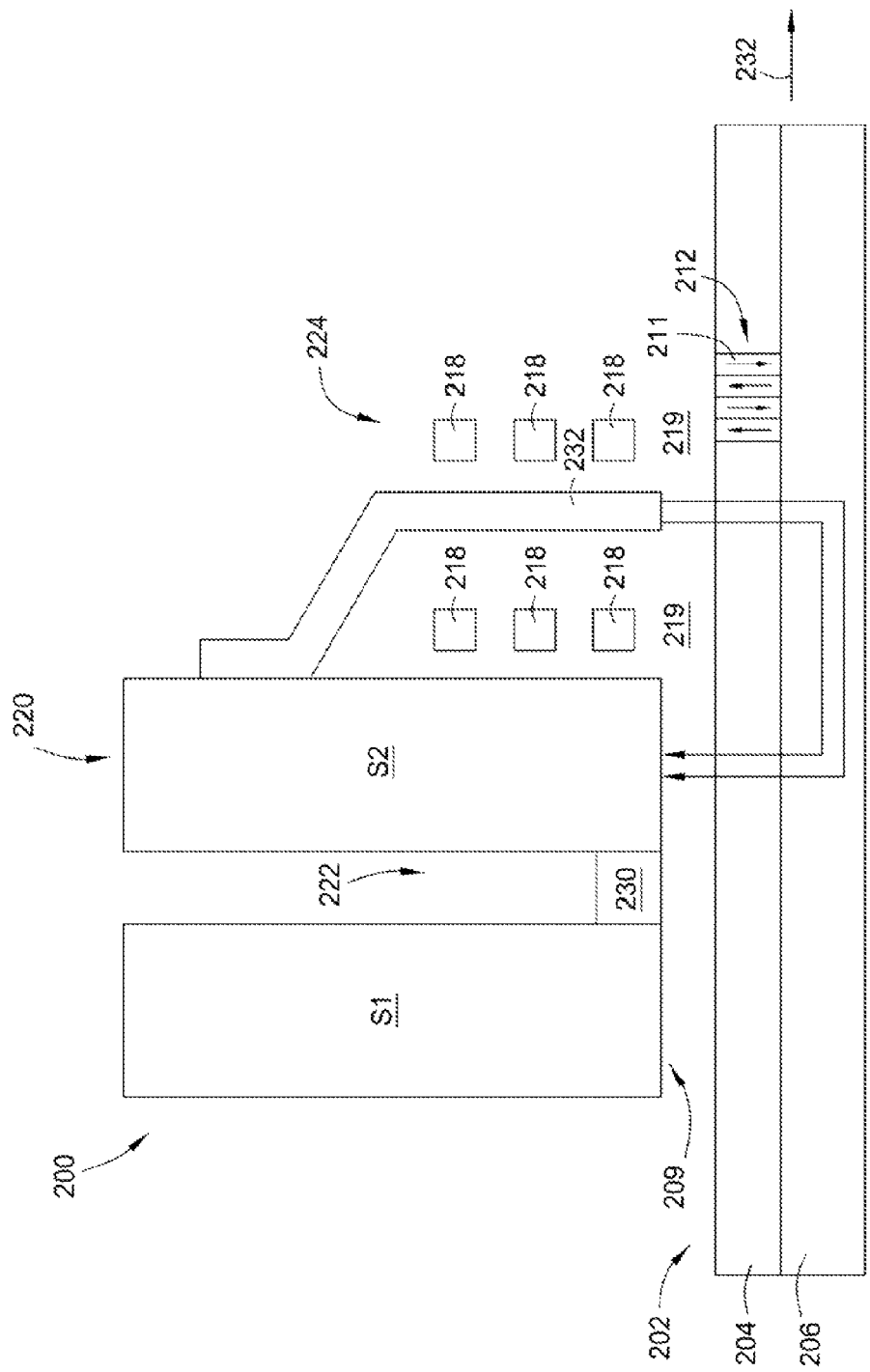
FIG. 2 is a side view of a read/write head and magnetic disk of the disk drive of FIG. 1, according to one embodiment of the disclosure.

FIG. 2 is a fragmented, cross-sectional side view through the center of a read/write head 200 facing magnetic disk 202. The read/write head 200 and magnetic disk 202 may correspond to the magnetic head 180 and magnetic disk 110, respectively in FIG. 1. In some embodiments, the magnetic disk 202 may be a "dual-layer" medium that includes a perpendicular magnetic data recording layer (RL) 204 on a "soft" or relatively low-coercivity magnetically permeable underlayer (PL) 206. The read/write head 200 includes a media facing surface (MFS) 209, such as an air bearing surface (ABS), a magnetic write head 220 and a magnetic read head sensor 222, and is mounted such that its media facing surface (MFS) 209 is facing the magnetic disk 202. In FIG. 2, the disk 202 moves past the head 200 in the direction indicated by the arrow 232. The magnetic data recording layer (RL) 204 is illustrated with perpendicularly recorded or magnetized regions 212, with adjacent regions 212 having magnetization directions, as represented by the arrows 211 located in the magnetic data recording layer (RL) 204. The magnetic fields of the adjacent magnetized regions 212 are detectable by the sensing element 230 as the recorded bits. The write head 220 includes a magnetic circuit 224 made up of a main pole 232 and a thin film coil 218 shown in the section embedded in nonmagnetic material 219.

In the embodiments discussed herein, the read head sensor 222 is a side shield read head sensor. A side shield read head sensor includes a soft magnetic body in the track width direction of the spin valve element, thus leading to sensitivity reduction at the skirt region of the read sensitivity distribution in the track width direction. The skirt reduction of the read sensitivity distribution occurs because the spin valve element captures the magnetic field generated at the center part of the recording track, and the magnetic shield formed by the soft magnetic body absorbs the magnetic field generated by portions of the recording track other than the center part. By reducing the skirt of the sensitivity distribution, the track density can be improved because the reading noise and interference of adjacent tracks can be reduced.

In the embodiment wherein the read head sensor 222 has a strong magnetically coupling with the upper shield S2, signal noise is often found high, which adversely data reading/writing capacity. Accordingly, maintaining a low magnetically coupling between the read head sensor 222 and the upper shield S2 may desirably enhance bias field generated therebetween and, thus, increasing domain controllability.

Figure 3:
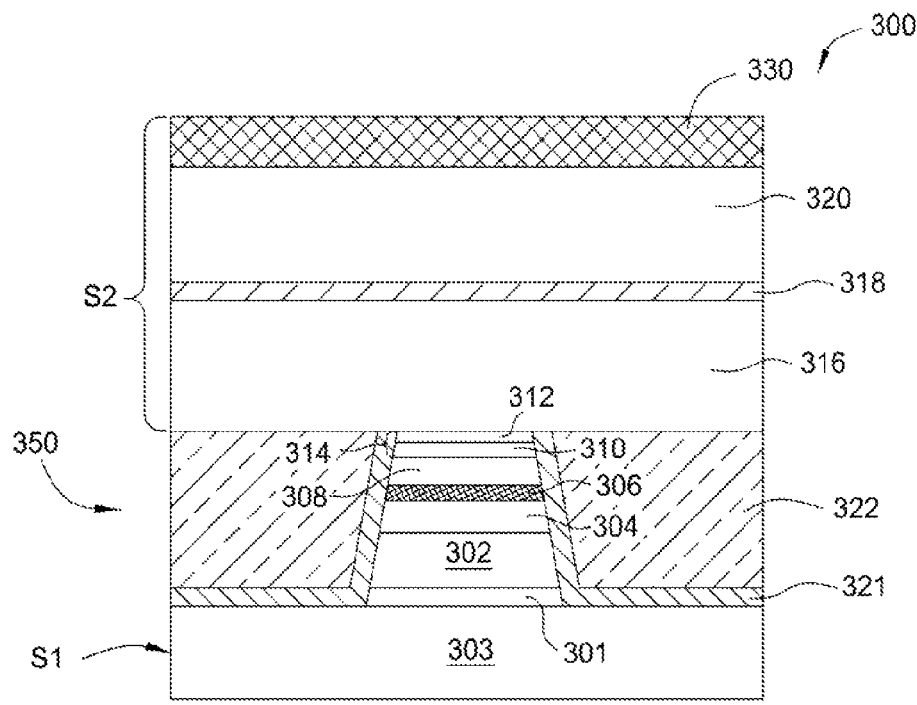
FIG. 3 is a schematic illustration of a read head according to one embodiment.

FIG. 3 is a media facing surface (MFS) view of a magnetic read head sensor 300, similar to the read/write head 200 depicted in FIG. 2, having a dual capping layer 314 formed in a sensor stack 350. The read head 300 comprises the sensor stack 350 formed between the lower shield S1 and the upper shield S2, as previously described with reference to FIG. 2. The sensor stack 350 includes an underlayer 301 and a first antiferromagnetic layer 302 disposed on the bottom shield S1. The underlayer 301 may comprise Ta, Ru or a compound of Ta and Ru and have a thickness of about 3 nm. In one embodiment, the first antiferromagnetic layer 302 comprises PtMn, IrMn, PtPdMn, NiMn or combinations thereof and has a thickness of about 60 angstroms. In one embodiment, the first antiferromagnetic layer 302 has a thickness of about 4 nm. A pinned magnetic layer 304 is then disposed on the first antiferromagnetic layer 302. The pinned magnetic layer 304 may have a thickness of about 2 nm. The pinned magnetic layer 304 may comprise one of several types of pinned layers, such as a simple pinned, antiparallel pinned, self pinned or antiferromagnetic pinned sensor. The pinned and reference layers can be constructed of several magnetic materials such as, for example NiFe, CoFe, CoFeB, or diluted magnetic alloys.

A spacer layer 306, which may be an oxide barrier layer in the case of a tunnel junction magnetoresistive (TMR) sensor or a conductive layer in the case of a giant magnetoresistive (GMR) sensor, is disposed on the pinned magnetic layer 304 below a free magnetic layer 308. If the read head 300 is a TMR sensor, then the spacer layer 306 may comprise MgO, $HfO_2$, $TiO_2$ or $Al_2O_3$. If the read head 300 is a GMR sensor, the spacer layer 306 may comprise a nonmagnetic conductive material, such as copper. The spacer layer 306 may have a thickness of about 1 nm.

The free magnetic layer 308 is disposed on the spacer layer 306. The free magnetic layer 308 may comprise Co, Fe, Ni, B, or combinations thereof such as CoFe, CoFeB or CoFeNiB. The free magnetic layer 308 has a thickness of between about 15 Angstroms and about 75 Angstroms. In one embodiment, the thickness is about 6 nm.

A dual capping layer 314 is then formed on the free magnetic layer 308. In one embodiment, the dual capping layer 314 includes a magnetic layer 312 disposed on a nonmagnetic layer 310. Unlike the conventional magnetic capping layer, the dual capping layer 314 includes the magnetic layer 312 disposed on the nonmagnetic layer 310. It is believed that the nonmagnetic layer 310 included in the dual capping layer 314 may efficiently reduce the magnetic coupling between the free magnetic layer 308 and the upper shield S2, thereby increasing the bias field generated adjacent to the sensor stack 350. It is desired to keep the magnetic coupling at a minimum range as the magnetic coupling as generated may undesirably result in magnetic noise increase and signal to noise ratio (SNR) decrease. Accordingly, by utilizing the dual capping layer 314 including a nonmagnetic layer 310 formed therein on the free magnetic layer 308, magnetically decouple may be efficiently achieved, thereby increasing the bias field as generated to the sensor stack 350 as well as enhancing the domain controllability in the free magnetic layer 308. As such, by utilizing a nonmagnetic layer 310 in the dual capping layer 314 above the free magnetic layer 308, the magnetic coupling between the free magnetic layer 308 and the upper shield S1 is efficiently weakened (e.g., magnetically de-coupling), thereby eliminating magnetic noise and increasing domain controllability. The nonmagnetic layer 310 may also provide additional magnetic spacing between the free magnetic layer 308 and the upper shield S2 to weaken magnetic coupling therebetween. The additional magnetic spacing as created by the nonmagnetic layer 310 may be maintained minimum, (e.g., a thin thickness of the nonmagnetic layer 310) so as to eliminate the read gap which may adversely decrease data density. In one embodiment, the nonmagnetic layer 310 is controlled to have a thickness less than 1 nm, such as less than 0.8 nm, for example between about 0.1 nm and about 0.5 nm.

In one embodiment, the nonmagnetic layer 310 may be fabricated from nonmagnetic materials (e.g., demagnetized) selected from a group including Ta, Mg and the like. In one example, the nonmagnetic layer 310 is a Ta layer having a thickness between about 0.1 nm and about 0.5 nm.

Furthermore, the magnetic layer 312 disposed on the nonmagnetic layer 310 may also be fabricated from a selected magnetic material that may ferromagnetically coupled to the upper shield S2 to provide enhanced magnetic bias as needed. In one embodiment, the magnetic layer 312 may be fabricated from a magnetic material selected from a group including NiFe, CoFe, and FeCoNi. In one embodiment, the magnetic layer 312 is a NiFe layer having a thickness between about 1 nm and about 6 nm.

The lower shield S1 and the upper shield S2 disposed below and above the sensor stack 350 are formed from an electric conductive material that may function as electrical leads for supplying a sense current to the sensor stack 350 as well as functioning as magnetic shields. In one embodiment, the lower shield S1 is formed by a magnetic material, such as NiFe.

The upper shield S2 may comprise multiple layers. The upper shield S2 may comprise a bottom magnetic layer 316 and a top magnetic layer 320 separated by a nonmagnetic spacer layer 318. A second antiferromagnetic layer 330 is disposed on the top magnetic layer 320. The second antiferromagnetic layer 330 comprises PtMn, IrMn, PtPdMn, NiMn or combinations thereof and has a thickness of about 60 angstroms. The nonmagnetic spacer layer 318 may comprise Ta, TaO, Ru, Rh, NiCr, SiC, or $Al_2O_3$. The bottom magnetic layer 316 and top magnetic layer 320 may each comprise a ferromagnetic material. Suitable ferromagnetic materials that may be utilized include Ni, Fe, Co, NiFe, NiFeCo, NiCo, CoFe and combinations thereof. The top magnetic layer 320 is antiferromegnetically coupled with the bottom magnetic layer 316 and the magnetization of the top magnetic layer 320 is unidirectionally fixed by the second antiferromagnetic layer 330. In one embodiment, the upper shield S2 comprises IrMn/NiFe/Ru/NiFe as a three layer structure.

An insulating layer 321 may be disposed along the sidewalls of the sensor stack 350 and above the lower shield S1. The insulating layer 321 may comprise an insulating material such as aluminum oxide or silicon nitride. The insulating layer 321 may be deposited by well known deposition methods such as atomic layer deposition (ALD), chemical vapor deposition (CVD), and ion beam sputtering (IBD).

A side shield 322 is disposed on the insulating layer 321. The side shield 322 may comprise a ferromagnetic material. Suitable ferromagnetic materials that may be utilized include Ni, Fe, Co, NiFe, NiFeCo, NiCo, CoFe and combinations thereof. The bottom magnetic layer 316 of the upper shield S2 and side shield 322 are ferromagnetically coupled. The reason for adopting such a construction is to achieve sufficient domain stability of the free magnetic layer 308 in the spin valve element. The upper shield S2 is magnetically stable due to the antiferromagnetically coupling structure. The side shield 322 is also stable because it is coupled ferromagnetically to the stable upper shield S2. In this situation, the bias field from side shield 322 to the free magnetic layer 308 becomes stable and has enough domain stability of a free magnetic layer.

Figure 4:
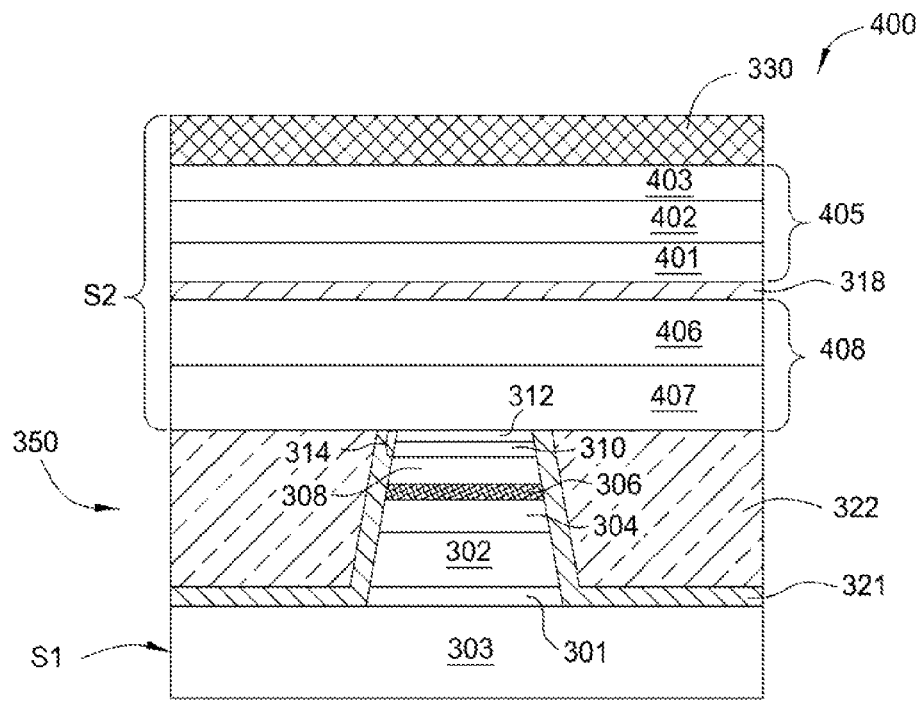
FIG. 4 is a schematic illustration of a read head according to another embodiment.

FIG. 4 depicts another embodiment of a read head sensor 400 having different multiple film structure of the upper shield S2 along with the dual capping layer 314 formed in the sensor stack 350. It is believed that by utilizing multiple layer of upper shield S2 with particularly selected materials, a desired range of magnetic permeability is maintained without adversely reduction due to the antiferromagnetically coupling structure. The magnetically-stable state of the upper shield S2 from the antiferromagnetically coupling structure may potentially reduce magnetic permeability. When the magnetic permeability is small, the shield effect becomes small, so the read resolution becomes poor. When reading recorded signals, if read resolution is worse, the signal to noise ratio (SNR) is lowered, due to increased magnetic transition noise, causing the error rate to become large. Accordingly, by utilizing the multiple film structure of the upper shield S2 in the read head sensor 400 depicted in FIG. 4, a desired range of magnetic permeability as well as high read resolution is obtained while providing sufficient domain stability.

In one embodiment, the upper shield S2 of the read head sensor 400 may have a bottom magnetic layer 408 and a top magnetic layer 405 separated by a nonmagnetic spacer layer 318, similar to the nonmagnetic spacer layer 318 depicted in FIG. 3. A second antiferromagnetic layer 330 is disposed on the top magnetic layer 405. The second antiferromagnetic layer 330 comprises PtMn, MnIr, PtPdMn, NiMn or combinations thereof and has a thickness of about 60 angstroms. The nonmagnetic spacer layer 318 may comprise Ta, TaO, Ru, Rh, NiCr, SiC, or $Al_2O_3$.

Unlike the single layer structure of the bottom magnetic layer 316 and the top magnetic layer 320 depicted in FIG. 3, the bottom magnetic layer 408 and the top magnetic layer 405 of the read head sensor 400 includes multiple layers. In one embodiment, the bottom magnetic layer 408 includes a first magnetic layer 406 disposed on a second magnetic layer 407. The top magnetic layer 405 includes a composite structure having a film stack including three magnetic materials, 403, 402, 401. Each of the magnetic material 401, 402, 403, 406, 407 may comprise a ferromagnetic material. Suitable ferromagnetic materials that may be utilized include Ni, Fe, Co, NiFe, NiFeCo, NiCo, CoFe and combinations thereof. In one particular embodiment, the top magnetic layer 405 includes a CoFe/NiFe/CoFe film stack (the magnetic layers 403, 402, 401) and the bottom magnetic layer 408 includes a CoFe/NiFe film stack (the magnetic layers 406, 407). Accordingly, the upper shield S2 of the read head sensor 400 comprises MnIr/CoFe/NiFe/CoFe/Ru/CoFe/NiFe film structure from the top second antiferromagnetic layer 330 to the bottom magnetic layer 408.

In FIGS. 3-4, the direction of bias magnetic field in the free magnetic layer 308 is anti-parallel to magnetization direction of bottom magnetic layer 316, 408 of the upper shield S2. The magnetic anisotropy and the magnetic coupling of bottom magnetic layer 316, 408 of the upper shield S2 is weakened effectually by the negative-directed bias field. Therefore, magnetic permeability of the upper shield S2 increases, and as a result, read resolution is improved.

Figure 5:
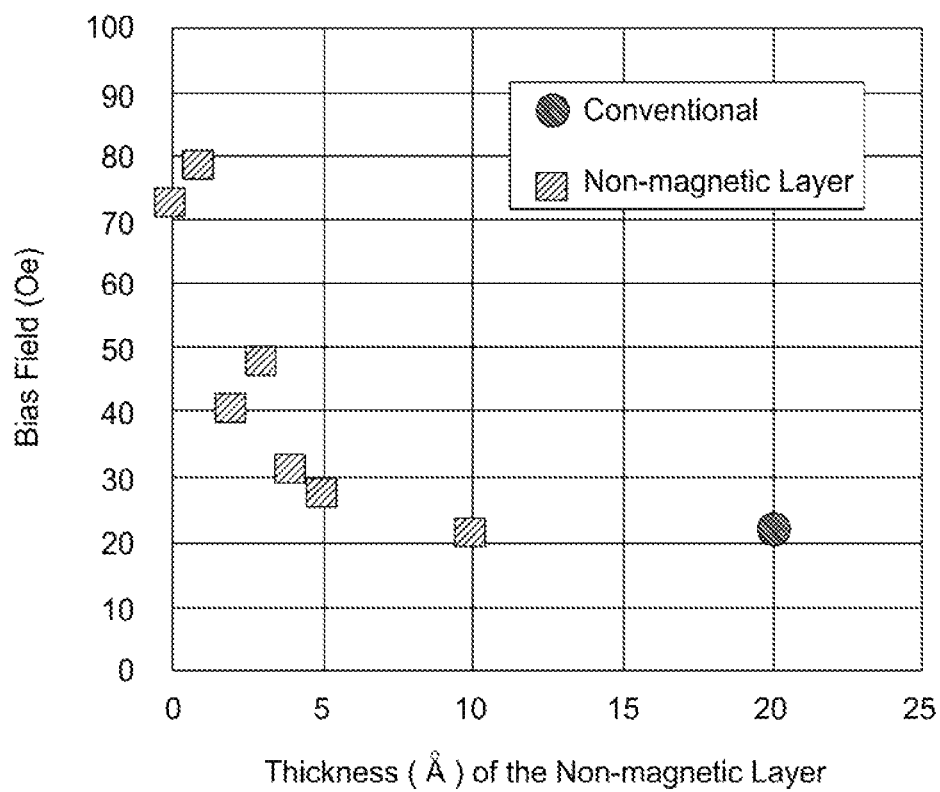
FIG. 5 is a graph depicting a relationship of thickness variation of a nonmagnetic layer to an magnitude of bias field generated in a read head sensor.

By utilizing a dual capping layer 314 in the sensor stack 350, the magnetic coupling between the free magnetic layer 308 and the upper shield S2 is weakened, providing an increased bias field. As shown in FIG. 5, the dual capping layer 314 including the magnetic layer 312 disposed on the nonmagnetic layer 310 may efficiently increase the bias field (square dots) up to about 80 Oe with a thin thickness of the nonmagnetic layer 310, as compared to the conventional capping layer (circle dots) at about 20 Oe without the nonmagnetic layer 310. Utilization of the nonmagnetic layer 310 along with the magnetic layer 312 in the dual capping layer 314 improves strength of the bias field for about 2 times to 4 times increase as compared to the conventional practice. Consequently, as the bias field is increased, domain controllability of the free magnetic layer 308 is thus improved as well as the read resolution.

Figure 6:
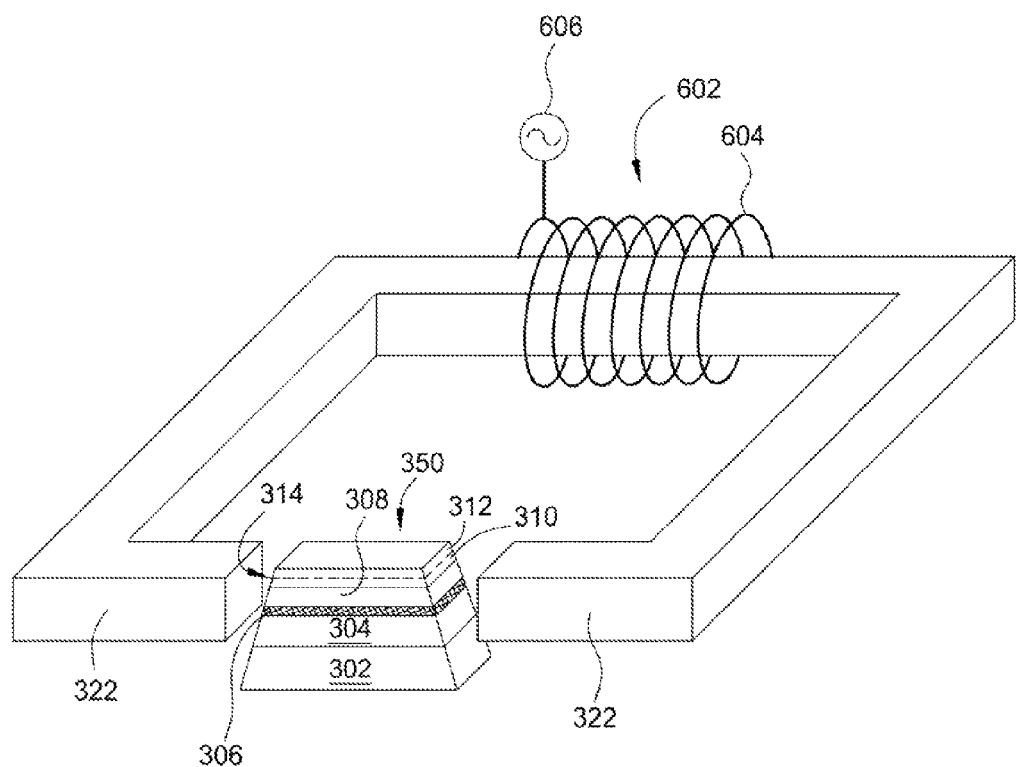
FIG. 6 is a three-dimensional schematic illustration of a side shield disposed in the read head sensor of FIG. 3 or 4 with a coil structure disposed adjacent to the side shield according to one embodiment.

FIG. 6 depicts a three-dimensional schematic illustration of a side shield 322 disposed in the read head 300, 400 of FIG. 3 or 4 with a coil structure 602 disposed adjacent to the side shield 322 according to one embodiment. The side shield 322 is disposed along the sidewall of the sensor stack 350 and above the lower shield S1 and below the upper shield S2. As discussed above, in order to keep the magnetic noise low, the magnetic coupling between the free magnetic layer 308 and the upper shield S2 is maintained low so that the bias field as generated therebetween is enhanced. Furthermore, it is believed that the bias field as generated is highly associated with the magnetic field contributed from the side shield 322. Accordingly, by adding a coil structure 602 disposed adjacent to the side shield 322, the bias field intensity may be further increased and adjusted when a magnetic field from the side shield is increased through enhancement of the coil structure 602 when energized.

In one embodiment, the coil structure 602 includes a plurality of coil windings 604 having a helical configuration. The coil structure 602 circumscribes an outer periphery of the side shield 322. The coil structure 602 may be positioned in any suitable location close to the side shield 322 to enhance positional control of magnetic field generated from the side shield 322 which may affect and contribute the level of the bias field generation to the sensor stack 350. In operation, the coil structure 602 is energized by a voltage power supplied to the coil structure 602 through a power generator 606. The voltage power applied to the coil structure 602 may affect the level of the magnetic field generated from the side shield 322. As the intensity (e.g., magnitude) of the magnetic field contributed from the side shield 322 is altered and increased, the bias field generated in the sensor stack 350 may be thus enhanced and increased. Accordingly, by utilizing the coil structure 602 disposed adjacent to the side shield 322 and the power level applied to the coil structure 602, different level of the bias field generated in the sensor stack 350 may be controlled so as to improve and optimize signal to noise ratio as well as magnetic storage density. In one embodiment, the coil structure 602 may be fabricated from a metallic material that may enhance magnetic field generation to the side shield 322. In one embodiment, the coil structure 602 may be fabricated from a material selected from a group consisting of stainless steel, copper, aluminum, nickel, alloys thereof, and the like.

Accordingly, by utilizing multiple layers for the upper shield S2 along with the dual capping layer 314, a weakened magnetic coupling may be obtained. Furthermore, a coil structure may be further disposed adjacent (e.g., circumscribing) the side shield 322 so as to enhance bias field generation to the sensor stack 350 in the read head sensors 300, 400. Such read head sensors have reader utilization controllability. By maintaining low magnetic coupling and enhanced magnetic field generated from the side shield, a strong bias field may be obtained. Therefore, next generation products can adopt the structure for ultrahigh-density recordings.

While the foregoing is directed to embodiments of the present disclosure, other and further embodiments of the disclosure may be devised without departing from the basic scope thereof, and the scope thereof is determined by the claims that follow.

What is claimed is:

1. A read head sensor, comprising:
a lower shield;
a upper shield disposed over the lower shield; and
a sensor stack disposed between the lower shield and the upper shield wherein the sensor stack comprises:
a pinned magnetic layer;
a spacer layer disposed above the pinned magnetic layer;
a free magnetic layer disposed above the spacer layer; and
a dual capping layer disposed on the free magnetic layer, the dual capping layer including a magnetic layer disposed on a nonmagnetic layer; and
a side shield disposed adjacent the sensor stack above the lower shield and below the upper shield, wherein the upper shield further comprises:
a bottom magnetic layer including a first magnetic layer and a second magnetic layer disposed on the first magnetic layer;
a first nonmagnetic layer disposed on the bottom magnetic layer;
a top magnetic layer disposed on the first nonmagnetic layer, the top magnetic layer including a three-layer magnetic film stack; and
an antiferromagnetic layer disposed on the top magnetic layer.

2. The read head sensor of claim 1, wherein the first and the second magnetic layers in the bottom magnetic layer are selected from at least one of NiFe, CoFe or NiCoFe.

3. The read head sensor of claim 1, wherein the first magnetic layer is CoFe and the second magnetic layer is NiFe.

4. The read head sensor of claim 1, wherein the three-layer magnetic film stack in the top magnetic layer includes a NiFe layer sandwiched between CoFe layers.

5. The read head sensor of claim 4, further comprising a coil structure coupled to the side shield.

6. A read head sensor, comprising:
a lower shield;
a upper shield disposed over the lower shield; and
a sensor stack disposed between the lower shield and the upper shield wherein the sensor stack comprises:
  a pinned magnetic layer;
  a spacer layer disposed above the pinned magnetic layer;
  a free magnetic layer disposed above the spacer layer; and
  a dual capping layer disposed on the free magnetic layer, the dual capping layer including a magnetic layer disposed on a nonmagnetic layer; and
a side shield disposed adjacent the sensor stack above the lower shield and below the upper shield, further comprising a coil structure coupled to the side shield.

7. A read head sensor, comprising:
a lower shield;
a upper shield disposed over the lower shield, wherein the upper shield includes:
  a bottom magnetic layer including a first magnetic layer and a second magnetic layer disposed on the first magnetic layer;
  a first nonmagnetic layer disposed on the bottom magnetic layer;
  a top magnetic layer disposed on the first nonmagnetic layer, the top magnetic layer including a three-layer magnetic film stack; and
  an antiferromagnetic layer disposed on the top magnetic layer;
a sensor stack disposed between the lower shield and the upper shield; and
a side shield disposed adjacent the sensor stack above the bottom shield and below the top shield, wherein the sensor stack further comprises:
  a pinned magnetic layer;
  a spacer layer disposed above the pinned magnetic layer;
  a free magnetic layer disposed above the spacer layer; and
  a dual capping layer disposed on the free magnetic layer, the dual capping layer including a magnetic layer disposed on a nonmagnetic layer.

8. The read head sensor of claim 7, wherein the magnetic layer in the dual capping layer comprises NiFe, CoFe or NiCoFe.

9. The read head sensor of claim 7, wherein the nonmagnetic layer is Ta.

10. The read head sensor of claim 7, wherein the nonmagnetic layer has a thickness less than 1 nm.

11. A read head sensor, comprising:
a lower shield;
a upper shield disposed over the lower shield;
a sensor stack disposed between the lower shield and the higher shield; and
a side shield disposed adjacent the sensor stack above the lower shield and below the upper shield; and
a coil structure disposed coupled to the side shield, wherein the sensor stack further comprises:
  a pinned magnetic layer;
  a spacer layer disposed above the pinned magnetic layer;
  a free magnetic layer disposed above the spacer layer; and
  a dual capping layer disposed on the free magnetic layer, the dual capping layer including a NiFe layer disposed on a Ta layer.

\* \* \* \* \*